(12) United States Patent
Kula et al.

(10) Patent No.: US 8,923,038 B2
(45) Date of Patent: Dec. 30, 2014

(54) MEMORY CELLS, SEMICONDUCTOR DEVICE STRUCTURES, MEMORY SYSTEMS, AND METHODS OF FABRICATION

(75) Inventors: Witold Kula, Sunnyvale, CA (US); Gurtej S. Sandhu, Boise, ID (US); Stephen J. Kramer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 109 days.

(21) Appl. No.: 13/527,173

(22) Filed: Jun. 19, 2012

(65) Prior Publication Data

US 2013/0334630 A1    Dec. 19, 2013

(51) Int. Cl.
*G11C 11/15*   (2006.01)
*G11C 11/00*   (2006.01)
*H01L 29/82*   (2006.01)

(52) U.S. Cl.
USPC ........... 365/158; 365/171; 365/130; 365/145; 365/173; 257/421; 438/3

(58) Field of Classification Search
USPC .............. 257/421; 438/3; 365/130, 145, 158, 365/171, 173
See application file for complete search history.

(56) References Cited

U.S. PATENT DOCUMENTS

| | | | |
|---|---|---|---|
| 4,882,936 A | 11/1989 | Garshelis | |
| 6,483,741 B1 * | 11/2002 | Iwasaki et al. | 365/170 |
| 6,703,249 B2 | 3/2004 | Okazawa et al. | |
| 6,771,534 B2 * | 8/2004 | Stipe | 365/158 |
| 6,806,096 B1 | 10/2004 | Kim et al. | |
| 6,992,359 B2 * | 1/2006 | Nguyen et al. | 257/421 |
| 7,095,933 B2 | 8/2006 | Barth | |
| 7,189,583 B2 | 3/2007 | Drewes | |
| 7,372,674 B2 | 5/2008 | Gill | |
| 7,563,486 B2 | 7/2009 | Barth | |
| 7,564,152 B1 | 7/2009 | Clark et al. | |

(Continued)

FOREIGN PATENT DOCUMENTS

EP    1353443 A2    10/2003
JP    2002314049 A   10/2002

(Continued)

OTHER PUBLICATIONS

Braun et al, Strain-Induced Perpendicular Magnetic Anisotropy in Ultrathin Ni Films on Cu3Au(0 0 1), Journal of Magnetism and Magnetic Materials 171 (1997) pp. 16-28.

(Continued)

*Primary Examiner* — Karen Kusumakar
(74) *Attorney, Agent, or Firm* — TraskBritt

(57) ABSTRACT

Methods of forming magnetic memory cells are disclosed. Magnetic and non-magnetic materials are formed into a primal precursor structure in an initial stress state of essentially no strain, compressive strain, or tensile strain. A stress-compensating material, e.g., a non-sacrificial, conductive material, is formed to be disposed on the primal precursor structure to form a stress-compensated precursor structure in a net beneficial stress state. Thereafter, the stress-compensated precursor structure may be patterned to form a cell core of a memory cell. The net beneficial stress state of the stress-compensated precursor structure lends to formation of one or more magnetic regions, in the cell core, exhibiting a vertical magnetic orientation without deteriorating a magnetic strength of the one or more magnetic regions. Also disclosed are memory cells, memory cell structures, semiconductor device structures, and spin torque transfer magnetic random access memory (STT-MRAM) systems.

28 Claims, 6 Drawing Sheets

(56) References Cited

U.S. PATENT DOCUMENTS

| | | | |
|---|---|---|---|
| 7,791,844 B2 | 9/2010 | Carey et al. | |
| 7,932,572 B2 | 4/2011 | Tsujiuchi | |
| 8,043,732 B2 | 10/2011 | Anderson et al. | |
| 8,068,317 B2 | 11/2011 | Gill | |
| 8,334,148 B2 | 12/2012 | Jeong et al. | |
| 2003/0064569 A1 | 4/2003 | Takayama et al. | |
| 2003/0103371 A1* | 6/2003 | Kim et al. | 365/145 |
| 2003/0199104 A1 | 10/2003 | Leuschner et al. | |
| 2004/0224243 A1 | 11/2004 | Yoshizawa et al. | |
| 2005/0106810 A1* | 5/2005 | Pakala et al. | 438/257 |
| 2006/0114714 A1* | 6/2006 | Kanegae | 365/158 |
| 2006/0118842 A1* | 6/2006 | Iwata | 257/295 |
| 2008/0164502 A1* | 7/2008 | Fukumoto et al. | 257/295 |
| 2008/0164548 A1* | 7/2008 | Ranjan et al. | 257/421 |
| 2010/0080048 A1* | 4/2010 | Liu et al. | 365/157 |
| 2010/0176472 A1 | 7/2010 | Shoji | |
| 2010/0230769 A1 | 9/2010 | Ozaki et al. | |
| 2010/0327248 A1 | 12/2010 | Khoueir et al. | |
| 2011/0031569 A1 | 2/2011 | Watts et al. | |
| 2011/0049657 A1 | 3/2011 | Tsukamoto et al. | |
| 2011/0121366 A1 | 5/2011 | Or-Bach et al. | |
| 2012/0015099 A1 | 1/2012 | Sun et al. | |
| 2012/0074511 A1 | 3/2012 | Takahashi et al. | |
| 2012/0075922 A1* | 3/2012 | Yamada et al. | 365/158 |
| 2012/0106233 A1* | 5/2012 | Katti | 365/145 |
| 2012/0155156 A1* | 6/2012 | Watts et al. | 365/158 |
| 2012/0217594 A1 | 8/2012 | Kajiyama | |
| 2012/0218813 A1* | 8/2012 | Oh et al. | 365/158 |

FOREIGN PATENT DOCUMENTS

| | | |
|---|---|---|
| JP | 2004104076 A | 4/2004 |
| JP | 2009194366 A | 8/2009 |
| KR | 10-2012-0008295 A | 1/2012 |

OTHER PUBLICATIONS

International Search Report, ISA/KR, International Application No. PCT/US2013/044542, Sep. 16, 2013, three (3) pages.
Written Opinion of the International Searching Authority, ISA/KR, International Application No. PCT/US2013/044542, Sep. 16, 2013, four (4) pages.

* cited by examiner

MEMORY CELLS, SEMICONDUCTOR DEVICE STRUCTURES, MEMORY SYSTEMS, AND METHODS OF FABRICATION

FIELD

The present disclosure, in various embodiments, relates generally to the field of memory device design and fabrication. More particularly, the present disclosure relates to design and fabrication of memory cells characterized as Spin Torque Transfer Magnetic Random Access Memory (STT-MRAM) cells.

BACKGROUND

Magnetic Random Access Memory (MRAM) is a non-volatile computer memory technology based on magnetoresistance. MRAM is non-volatile and so can maintain memory content when an MRAM memory device is not powered. MRAM data is stored by magnetoresistive elements. Generally, the magnetoresistive elements in an MRAM cell are made from two magnetic regions, each of which accepts and sustains magnetization. The magnetic field of one region (the "fixed region") is fixed in its magnetic orientation, and the magnetic orientation of the other region (the "free region") can be changed during operation. Thus, a programming current can cause the magnetic orientations of the two magnetic regions to be either parallel, giving a lower electrical resistance across the magnetoresistive elements (which may be defined as a "0" state), or anti-parallel (i.e., directed oppositely, e.g., 180 degrees, from the parallel orientation), giving a higher electrical resistance across the magnetoresistive elements (which may be defined as a "1" state) of the MRAM cell. The switching of the magnetic orientation of the free region and the resulting high or low resistance states across the magnetoresistive elements enables the write and read operations of the typical MRAM cell.

One type of MRAM cell is a spin torque transfer MRAM (STT-MRAM) cell. A conventional STT-MRAM cell may include a magnetic cell core, which may include a magnetic tunnel junction (MTJ), or may include a spin valve structure. An MTJ is a magnetoresistive data storing element including two magnetic regions (one fixed and one free) and a non-magnetic, electrically insulating region in between, which may be accessed through data lines (e.g., bit lines), access lines (e.g., word lines), and an access transistor. A spin valve has a structure similar to the MTJ, except a spin valve employs a non-magnetic, electrically conductive region between the two magnetic regions.

In operation, a programming current may be caused to flow through the access transistor and the magnetic cell core. The fixed region within the cell core polarizes the electron spin of the programming current, and torque is created as the spin-polarized current passes through the core. The spin-polarized electron current interacts with the free region by exerting a torque on the free region. When the torque of the spin-polarized electron current passing through the core is greater than a critical switching current density ($J_c$) of the free region, the torque exerted by the spin-polarized electron current is sufficient to switch the direction of the magnetization of the free region. Thus, the programming current can be used to cause the magnetic orientation of the free region to be aligned either parallel to or anti-parallel to the orientation of the fixed region, and, when the magnetic orientation of the free region is switched between parallel and anti-parallel, the resistance state across the core is changed.

The free regions and fixed regions of conventional STT-MRAM cells exhibit magnetic orientations that are horizontal, also known as "in-plane," with the width of the regions. Efforts have been made to form perpendicularly oriented ("out-of-plane") STT-MRAM cells in which the fixed regions and the free regions exhibit vertical magnetic orientations (also known in the art as perpendicular magnetizations). However, finding and implementing suitable materials and designs for the cell core and forming the cell core structure has been a challenge. For example, as illustrated in FIG. 1, in forming a magnetic cell core of a conventional STT-MRAM cell with PMA, materials may be formed over a substrate 110. The materials may include a conductive material 120, optional intermediary materials 130, magnetic materials 140, a non-magnetic material 150, additional optional intermediary materials 160, and a hard mask material 170, the combination of materials together forming a precursor structure 100, as illustrated in FIG. 1. The hard mask material 170, to be used in a subsequent patterning process, may be a sacrificial, non-conductive material. With reference to FIG. 2, one or more of the magnetic materials 140 within the precursor structure 100 may exhibit a vertical magnetic orientation 180 upon initial formation.

The magnetic materials 140 exhibiting the vertical magnetic orientation 180 may also be characterized by a strength of the magnetic materials' 140 perpendicular magnetic anisotropy ("PMA"). The strength (also referred to herein as the "magnetic strength" or the "PMA strength") is an indication of the magnetic materials' 140 resistance to alteration of the magnetic orientation. A magnetic material exhibiting a vertical magnetic orientation 180 with a high magnetic strength may be less prone to alteration of its magnetic orientation out of the vertical alignment than a magnetic material exhibiting a vertical magnetic orientation 180 with a lower magnetic strength.

Following formation of the precursor structure 100 (FIG. 1), with reference to FIG. 3, the precursor structure 100 (FIG. 1) may thereafter be patterned, e.g., etched, to form a cell core structure 300. Ideally, the cell core structure 300 may have a structure defining sidewalls indicated by dashed lines 302, with essentially vertical sidewalls along the etched conductive material 120, intermediary materials 130, 160, magnetic materials 140, non-magnetic material 150, and hard mask material 170. However, conventional material formation processes may result in one or more of the formed materials 120, 130, 140, 150, 160, 170 experiencing a lateral, residual tensile stress or lateral, compressive stress upon initial formation of the precursor structure 100, and conventional patterning processes used to form the cell core structure 300 may cause responses to these stresses in a resulting strain, manifested in lateral contraction or expansion of the respective materials 120, 130, 140, 150, 160, 170 as illustrated by oblique sidewalls 304.

The strain exhibited by lateral material expansion, or, in some circumstances, contraction, of the previously-stressed precursor structure 100 (FIG. 1) may deteriorate the magnetic strength of one or more of the magnetic materials 140, e.g., in the free region, in the fixed region, or in both the free region and the fixed region. For example, the magnetic strength may decrease, increasing the risk that the magnetic material's 140 magnetic orientation 180 may be unintentionally shifted out of the vertical orientation. In extreme cases, therefore, the magnetic strength may deteriorate to such an extent that the magnetic orientation 180 shifts out of vertical, as illustrated in FIG. 4. Consequently, conventional processes for fabricating STT-MRAM cells with perpendicular magnetizations (also referred to herein as "vertical magnetic orientations"), may adversely impact, e.g., deteriorate, the net magnetic strength, i.e., the strength of the PMA, or even alter the direction, e.g., alignment, of the magnetic orientation 180, compared to the magnetic strength and orientation of the magnetic materials prior to patterning. The reduced magnetic strength or, in extreme circumstances, altered magnetic orientation may lower the energy barrier and weaken bit thermal stability and may adversely affect data retention in the resulting STT-MRAM cell.

DETAILED DESCRIPTION

Figure 1:
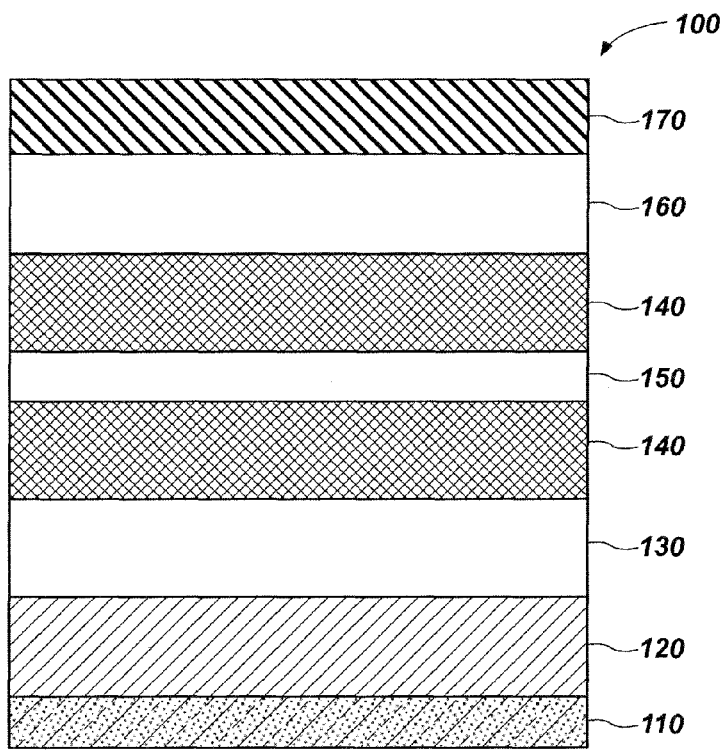
FIG. 1 is a cross-sectional, elevation, schematic illustration of a conventional precursor structure during a stage of fabrication of a conventional STT-MRAM cell according to a conventional fabrication process.
Figure 2:
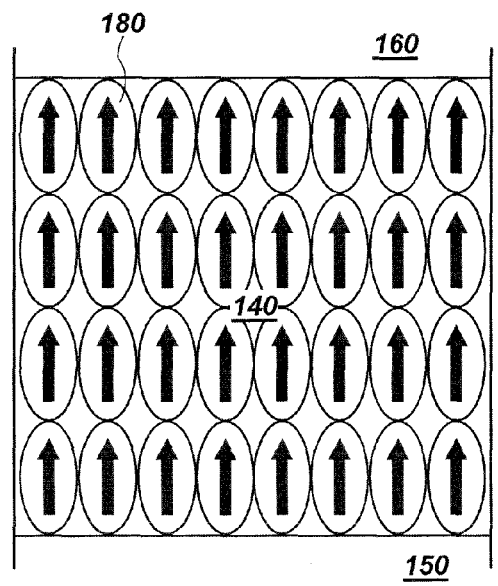
FIG. 2 is a cross-sectional, elevation, schematic illustration of a magnetic region of the conventional precursor structure of FIG. 1.

Memory cells, semiconductor device structures including such memory cells, memory systems, and methods of forming such memory cells and memory cell structures are disclosed. The memory cells include a cell core having a magnetic region exhibiting a vertical magnetic orientation of a magnetic strength. The cell core is patterned from a stress-compensated precursor structure that includes a stress-compensating material formed so as to be disposed on a primal precursor structure of magnetic and non-magnetic materials, at least one of the magnetic materials exhibiting the vertical magnetic orientation at an initial magnetic strength. The processes, materials, and conditions with which the stress-compensating material is formed may be selected to tailor a net strain exhibited by the stress-compensated precursor structure. Following etching of the cell core from the stress-compensated precursor structure, one or more of the magnetic regions of the formed cell core exhibit the vertical magnetic orientation of the primal precursor structure at a maintained or enhanced magnetic strength.

In some embodiments, the stress-compensating material is configured to induce a tensile stress to counteract a compressive stress experienced by the primal precursor structure. In other embodiments, the stress-compensating material is configured to induce a compressive stress to counteract a tensile stress experienced by the primal precursor structure. Thus, the resulting memory cell structure may exhibit, before or after patterning, a net zero strain state. In other embodiments, the stress-compensating material is configured to induce tensile stress or compressive stress to partially or overly counteract a compressive stress or tensile stress, respectively, experienced by the primal precursor structure. Thus, the resulting memory cell structure may exhibit, before or after patterning, a net tensile or compressive strain. Accordingly, the stress state of the stress-compensating material may be tailored to affect a strain state exhibited by the stress-compensated precursor structure so as to maintain or enhance a magnetic strength, and, therefore, a vertical magnetic orientation, in the free region of the cell core of the resulting memory cell.

As used herein, the term "net," when referring to strain, refers to an overall strain exhibited by a structure of materials or regions, which may be a sum of strains exhibited by the individual materials or regions within the structure. Thus, though one material of a structure may exhibit a compressive strain and another material of the structure may exhibit a tensile strain, the net strain of the structure may be effectively negated, i.e., may exhibit a "net zero strain," may be somewhat compressive, or may be somewhat tensile, depending on a ratio of the strain of the one or more materials to the strain of one or more other materials, taking into consideration the relative dimensions, e.g., thicknesses, of the materials concerned.

As used herein, the term "primal precursor structure" refers to a structure prior to patterning, e.g., etching, to form a resulting structure.

As used herein, the term "substrate" means and includes a base material or construction upon which components, such as those within memory cells, are formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, regions, or junctions in the base semiconductor structure or foundation.

As used herein, the term "STT-MRAM cell" means and includes a magnetic cell structure that may include an MTJ, as discussed above, if a non-magnetic region, disposed between the free region and the fixed region, is insulative. Alternatively, the magnetic cell structure of the STT-MRAM cell may include a spin valve, if the non-magnetic region, disposed between the free region and the fixed region, is conductive.

As used herein, the term "fixed region" means and includes a region of magnetic material within the STT-MRAM cell that has a fixed magnetic orientation during use and operation of the STT-MRAM cell in that a current effecting a change in the magnetization direction of one magnetic region, e.g., the free region, of the cell core may not effect a change in the magnetization direction of the fixed region. The magnetic strength of the magnetic material of the fixed region may be affected by a state of strain exhibited by the magnetic material of the fixed region.

As used herein, the term "free region" means and includes a region of magnetic material within the STT-MRAM cell that has a switchable magnetic orientation during use and operation of the STT-MRAM cell. The magnetic orientation may be switched between a "parallel" direction, in which the magnetic orientation exhibited by the free region and the magnetic orientation exhibited by the fixed region are directed in the same direction, and an "anti-parallel" direction, in which the magnetic orientation exhibited by the free region and the magnetic orientation exhibited by the fixed region are directed in oppositely directed directions. As with the fixed region, the free region may be formed of a magnetic material having a magnetic strength thereof affected by a state of strain exhibited by the free region.

As used herein, the term "cell core" means and includes a memory cell structure comprising the free region and fixed region and through which, during operation of the memory cell, current flows to effect a parallel or anti-parallel magnetic orientation within the free region.

As used herein, the term "vertical" means and includes a direction that is perpendicular to the width of the respective region. "Vertical" may also mean and include a direction that is perpendicular to a primary surface of a substrate on which the STT-MRAM cell is located.

As used herein, spatially relative terms, such as "beneath," "below," "lower," "bottom," "above," "upper," "top," "front," "rear," "left," "right," and the like, may be used for ease of description to describe a special relationship of one element or feature to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (rotated 90 degrees, inverted, etc.) and the spatially relative descriptors used herein interpreted accordingly.

As used herein, reference to an element as being "on" or "over" another element means and includes the element being directly on top of, adjacent to, underneath, or in direct contact with the other element. It also includes the element being indirectly on top of, adjacent to, underneath, or near the other element, with other elements present therebetween. In contrast, when an element is referred to as being "directly on" another element, there are no intervening elements present.

As used herein, the terms "comprises," "comprising," "includes," and/or "including" specify the presence of stated features, regions, integers, stages, operations, elements, materials, components, and/or groups, but do not preclude the presence or addition of one or more other features, regions, integers, stages, operations, elements, materials, components, and/or groups thereof.

As used herein, "and/or" includes any and all combinations of one or more of the associated listed items.

As used herein, the singular forms "a," "an," and "the" are intended to include the plural forms as well, unless the context clearly indicates otherwise.

The illustrations presented herein are not meant to be actual views of any particular material, component, region, structure, device, or system, but are merely idealized representations that are employed to describe embodiments of the present disclosure.

Embodiments are described herein with reference to the illustrations. Variations from the shapes of the illustrations as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features. Moreover, sharp angles that are illustrated may be rounded. Thus, the regions illustrated in the figures are schematic in nature and their shapes are not intended to illustrate the precise shape of a region and do not limit the scope of the present claims.

The following description provides specific details, such as material types and processing conditions, in order to provide a thorough description of embodiments of the disclosed devices and methods. However, a person of ordinary skill in the art will understand that the embodiments of the devices and methods may be practiced without employing these specific details. Indeed, the embodiments of the devices and methods may be practiced in conjunction with conventional semiconductor fabrication techniques employed in the industry.

The fabrication processes described herein do not form a complete process flow for processing semiconductor device structures. The remainder of the process flow is known to those of ordinary skill in the art. Accordingly, only the methods and semiconductor device structures necessary to understand embodiments of the present devices and methods are described herein.

Unless the context indicates otherwise, the materials described herein may be formed by any conventional technique, including, but not limited to, spin coating, blanket coating, chemical vapor deposition ("CVD"), plasma-enhanced CVD, atomic layer deposition ("ALD"), plasma-enhanced ALD, or physical vapor deposition ("PVD"). Alternatively, the materials may be grown in situ. Depending on the specific material to be formed, the technique for depositing or growing the material may be selected by a person of ordinary skill in the art.

Reference will now be made to the drawings, where like numerals refer to like components throughout. The drawings are not necessarily to scale.

A method of forming a memory cell is disclosed. The method includes forming a primal precursor structure including magnetic materials and non-magnetic materials, at least one of which may be disposed between a plurality of the magnetic materials. The primal precursor structure experiences an initial stress state. A stress-compensating material is formed so as to be disposed on the primal precursor structure. The stress-compensating material, which may be a non-sacrificial, conductive material, experiences a stress state opposing the initial stress state experienced by the primal precursor structure. Thus, the stress-compensating material may at least partially compensate for the stress of the primal precursor structure to form a stress-compensated precursor structure in a desired stress state, e.g., a state of zero net stress, a state of compressive stress-induced stress, or a state of tensile stress-induced stress. The desired state of stress is tailored such that, following patterning of the stress-compensated precursor structure, a resulting cell core structure includes magnetic regions, e.g., fixed and free regions, exhibiting a vertical magnetic orientation at a magnetic strength, which strength may be substantially the same as or enhanced compared a magnetic strength of the magnetic regions of the primal precursor structure.

The desired state of stress of the stress-compensated precursor structure may also be tailored to inhibit post-etching material expansion or contraction due to stress release in the form of material relaxation. For example, the stress-compensated precursor structure may be formed to exhibit a net zero stress, such that the stress-compensated precursor structure lacks a residual stress to release when etched. Therefore, a magnetic material of a stress-compensated precursor structure exhibiting a vertical magnetic orientation at a magnetic strength before patterning may continue to exhibit the vertical magnetic orientation at substantially the same or increased magnetic strength, without deterioration, after patterning.

Figure 5:
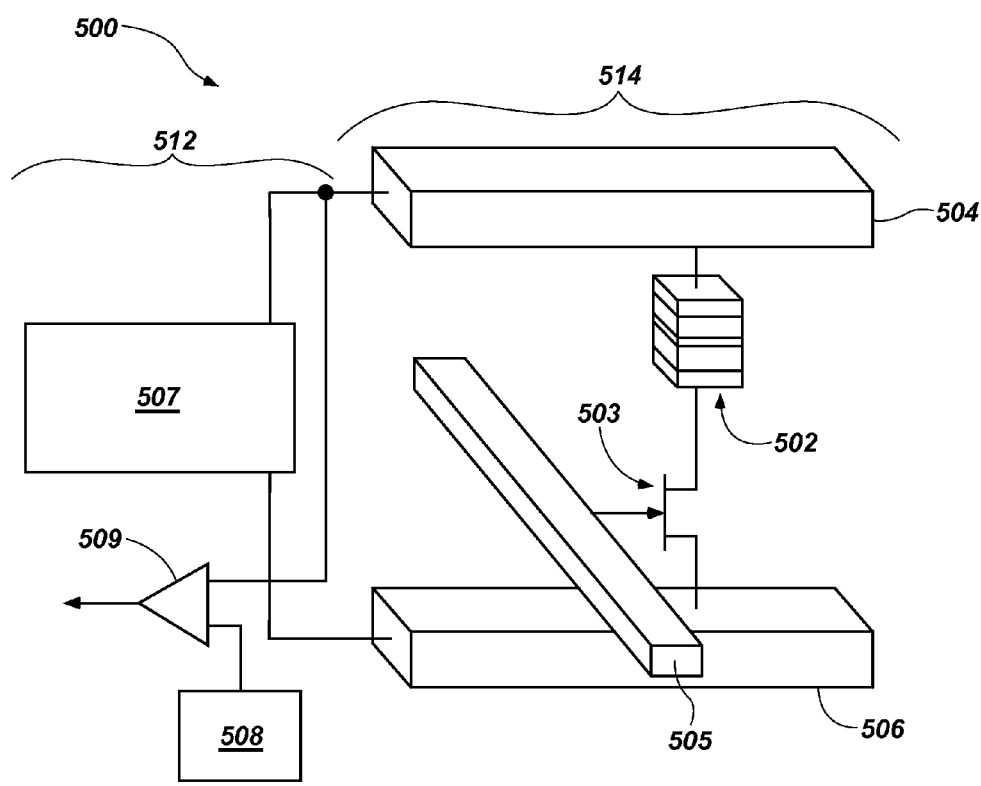
FIG. 5 is a schematic diagram of an STT-MRAM system having a memory cell according to an embodiment of the present disclosure.

FIG. 5 illustrates a STT-MRAM system 500 that includes peripheral devices 512 in operable communication with an STT-MRAM cell 514, a plurality of which may be fabricated to form an array of memory cells in a grid pattern including a number of rows and columns, or in various other arrangements, depending on the system requirements and fabrication technology. The STT-MRAM cell 514 includes a cell core 502, a select device 503 (e.g., an access transistor), a conductive material that may function as a data/sense line 504 (e.g., a bit line), a conductive material that may function as an access line 505 (e.g., a word line), and a conductive material that may function as a source line 506. The peripheral devices 512 of the STT-MRAM system 500 may include read/write circuitry 507, a bit line reference 508, and a sense amplifier 509. The cell core 502 may include a magnetic tunnel junction (MTJ), including a free region and a fixed region. During fabrication, a stress experienced by materials of a primal precursor structure, from which the cell core 502 is formed, may have been counteracted by a stress induced by a stress-compensating material, which may be a conductive material forming a part of the conductive material functioning as the data/sense line 504. Thus, forming the resulting STT-MRAM cell 514 includes patterning a stress-compensated structure exhibiting a net strain tailored such that the free region, the fixed region, or both regions of the formed cell core 502 exhibit a vertical magnetic orientation without deteriorating the magnetic strength thereof.

In use and operation, when the STT-MRAM cell 514 is selected to be programmed, a programming current is applied to the STT-MRAM cell 514, and the current is spin-polarized by the fixed region and exerts a torque on the free region, which switches the magnetization of the free region to "write to" or "program" the STT-MRAM cell 514. In a read operation of the STT-MRAM cell 514, a current is used to detect the resistance state of the cell core 502. Due to formation of the cell core 502 having a desired net strain (zero or otherwise), the magnetic strength, and therefore, the vertical magnetic orientation, of the free region, the fixed region, or both within the STT-MRAM cell 514, may be maintained or enhanced, e.g., during patterning, such that the STT-MRAM cell 514 may have improved thermal stability compared to a conventional STT-MRAM cell. The maintained or enhanced magnetic strength may further enable use of a cell core 502 with a smaller lateral dimension, thus providing improved scalability and device density.

To initiate programming of the STT-MRAM cell 514, the read/write circuitry 507 may generate a write current to the data/sense line 504 and the source line 506. The polarity of the voltage between the data/sense line 504 and the source line 506 determines the switch in magnetization of the free region in the cell core 502. Once the free region is magnetized according to the spin polarity of the programming current, the programmed state is written to the STT-MRAM cell 514.

To read the STT-MRAM cell 514, the read/write circuitry 507 generates a read current to the data/sense line 504 and the source line 506 through the cell core 502 and the select device 503. The programmed state of the STT-MRAM cell 514 relates to the resistance across the cell core 502, which may be determined by the voltage difference between the data/sense line 504 and the source line 506. In some embodiments, the voltage difference may be compared to the bit line reference 508 and amplified by the sense amplifier 509.

Figure 6:
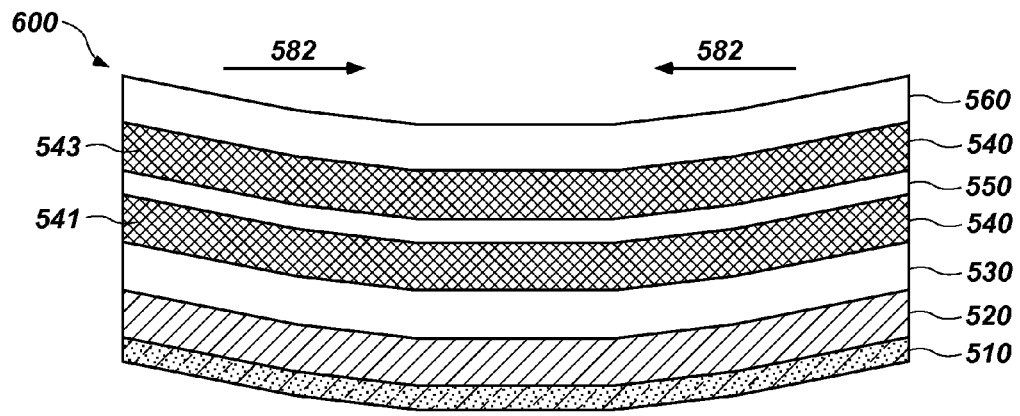
FIG. 6 is a cross-sectional, elevation, schematic illustration of a primal precursor structure in a state of tensile strain during a stage of fabrication of an STT-MRAM cell according to an embodiment of the present disclosure.

To form the STT-MRAM cell 514, a primal precursor structure, such as primal precursor structure 600 illustrated in FIG. 6, may be formed. The primal precursor structure 600 includes a conductive material 520 formed over a substrate 510. A plurality of magnetic materials 540 may be formed over the conductive material 520, with one or more intermediary materials 530 formed to be disposed between the conductive material 520 and one of the magnetic materials 540, e.g., the lower-most magnetic material 541. The intermediary materials 530 may include non-magnetic materials, transitional materials, diffusion barrier materials, buffer materials, and compatibility materials, or other conventional materials of a conventional STT-MRAM cell. Likewise, one or more other intermediary materials 560 may be formed over one of the plurality of magnetic materials 540, e.g., the upper-most magnetic material 543. A non-magnetic material 550 may be formed to be disposed between magnetic materials 540. The non-magnetic material 550 may comprise $Al_xO_y$, MgO, AlN, SiN, $CaO_x$, $NiO_x$, $Hf_xO_y$, $Ta_xO_y$, $Zr_xO_y$, $NiMnO_x$, $Mg_xF_y$, SiC, $SiO_2$, $SiO_xN_y$, or any combination of the above materials.

The magnetic material 540 of the free region, the fixed region, or both may comprise ferromagnetic materials, such as Co, Fe, Ni or its alloys, NiFe, CoFe, CoNiFe, or doped alloys CoX, CoFeX, CoNiFeX (X=B, Cu, Re, Ru, Rh, Hf, Pd, Pt, C), or other half-metallic ferromagnetic material, such as NiMnSb and PtMnSb, for example. More particularly, for example, magnetic material 540 may comprise one or more of a material exhibiting magnetostriction (e.g., without limitation, $Co_xFe_yB_z$ with an atomic ratio of x:y:z between about 20:60:20 and 60:20:20), a material exhibiting an $L1_0$ crystal structure, a material exhibiting a uniaxial magnetic anisotropy, and a Heusler alloy, which characteristics are not mutually exclusive. Alternatively or additionally, in some embodiments, magnetic material 540 may comprise layered materials. For example, and without limitation, magnetic material 540 may comprise repeating layers of cobalt and platinum, with a layer of platinum disposed between layers of cobalt and vice versa. As another example, without limitation, magnetic material 540 may comprise repeating layers of cobalt and nickel, with a layer of nickel disposed between layers of cobalt and vice versa.

In some embodiments the magnetic material 540 of the lower-most magnetic material 541 may have the same composition, structure, or both as the magnetic material 540 of the upper-most magnetic material 543. In other embodiments, the magnetic material 540 of the lower-most magnetic material 541 may have a different composition, structure, or both than the magnetic material 540 of the upper-most magnetic material 543.

The materials of the primal precursor structure 600 may be formed by one or more conventional fabrication processes that form the materials 520, 530, 540, 550, 560 in a state of stress in the lateral direction, e.g., a state of lateral, tensile stress or a state of lateral, compressive stress. In some embodiments, one or more of the materials 520, 530, 540, 550, 560 may be formed to exhibit essentially no lateral stress, i.e., in a state of zero stress.

For example, and without limitation, one or more of the materials 520, 530, 540, 550, 560 may be formed, e.g., to a thickness in the range of from about one nanometer to about five nanometers, by sputtering. In a formation process like sputtering, atoms with certain energy are bombarded onto a base material and then into formed portions of the material as formation continues. Depending on the nature of the material being formed and the energy of the bombarding atoms, stress may build up in the lateral direction. In sputtering processes utilizing high-energy bombardment, a resulting formed material may be in a state of compressive stress in the lateral direction. Conversely, in sputtering processes utilizing low-energy bombardment, a resulting film of formed material may be in a state of tensile stress in the lateral direction.

In a sputtering process, the energy of a bombarding species, and thus the state of stress in which the material is formed, may be tailored by adjusting deposition pressure and gas pressure of inherent gas species involved, e.g., argon gas. When the pressure utilized is relatively low, bombarding species may be less likely to be thermalized between a sputtering target and a receiving base material. Accordingly, bombardment at the film level may occur at high energy, potentially resulting in a compressively stressed material. Conversely, when the pressure utilized during sputtering is relatively high, bombarding species may be more likely to be thermalized between the sputtering target and the receiving base material such that bombardment at the film level may occur at low energy, potentially resulting in a tensilely stressed material. The pressure utilized during sputtering, and other conditions, may also be adjusted to form a material not exhibiting a stress, i.e., a material in a state of zero stress. However, the conditions for such tensile or zero-stress formation processes may not be practical when seeking to achieve desired magnetic properties, smoothness and grain size of the material to be formed.

Accordingly, depending on the materials, processes, and conditions with which the materials 520, 530, 540, 550, 560 of the primal precursor structure 600 are formed, the primal precursor structure 600 may experience a net tensile stress as indicated by arrows 582 depicting a resulting strain. In other embodiments, such as that illustrated in FIG. 7, which other embodiments may utilize different materials, processes, or conditions with which the materials 520, 530, 540, 550, 560 are formed, a primal precursor structure 700 formed therefrom may experience a net compressive stress, as indicated by arrows 584 depicting a resulting strain. In some embodiments, the strain exhibited by the primal precursor structure 600, 700 may be detected and measured by observing a curvature of the primal precursor structure 600, 700 as is known by those of ordinary skill in the art.

Figure 3:
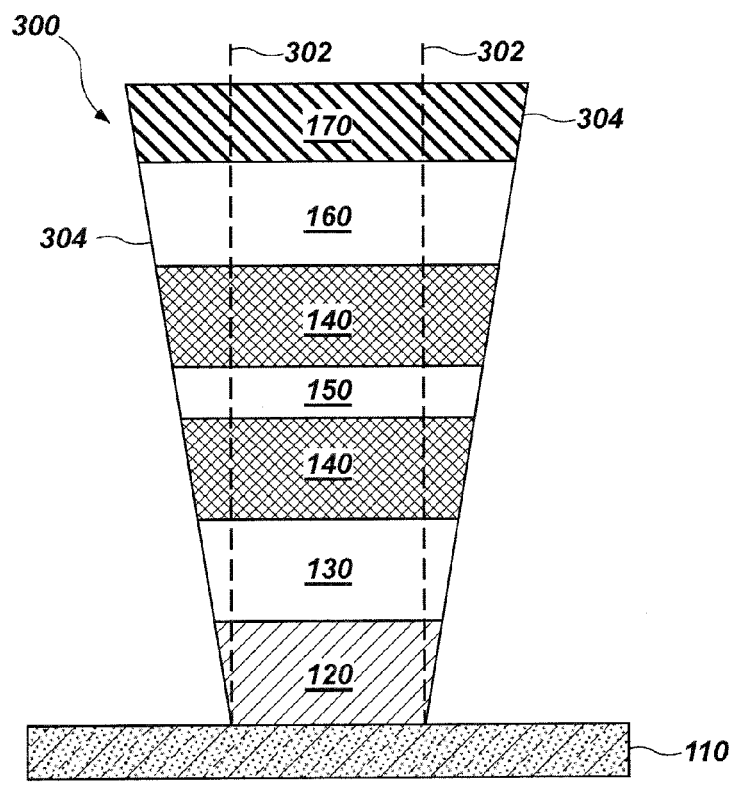
FIG. 3 is a cross-sectional, elevation, schematic illustration of a conventional STT-MRAM cell core structure during a stage of fabrication according to a conventional fabrication process, illustrating patterning of the conventional precursor structure of FIG. 1.
Figure 4:
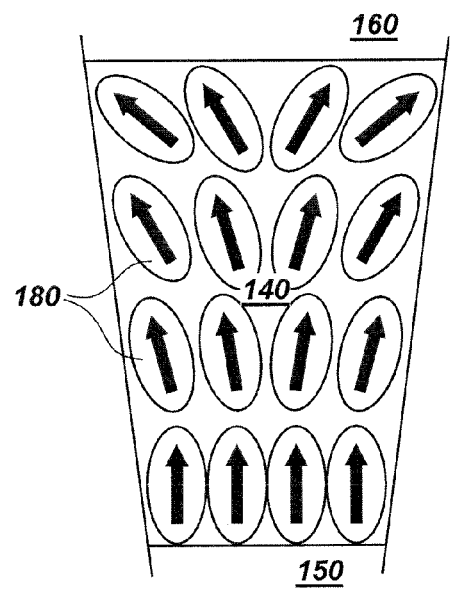
FIG. 4 is a cross-sectional, elevation, schematic illustration of a magnetic region of the conventional STT-MRAM cell core structure of FIG. 3.

Were the primal precursor structures 600, 700 to be subsequently patterned, i.e., etched, as described above in regard to FIG. 3, to form a cell core, the stress in the materials of such structures 600, 700 may be released in the form of strain, resulting in either lateral contraction of the materials, e.g., the materials of the primal precursor structure 600 of FIG. 6, or lateral expansion of the materials, e.g., the materials of the primal precursor structure 700 of FIG. 7. As illustrated in FIG. 4 and discussed above, such lateral expansion or contraction may deteriorate a magnetic strength of one or more of the magnetic materials 540 within the primal precursor structure 600, 700. Extreme expansion or contraction may deteriorate the magnetic strength so substantially as to also deteriorate the vertical magnetic orientation, as well, i.e., may alter the magnetic orientation out of the vertical direction.

Figure 8:
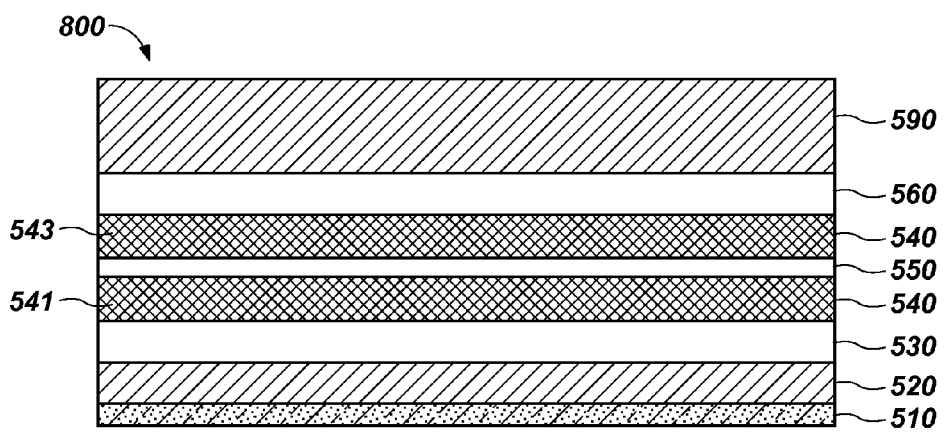
FIG. 8 is a cross-sectional, elevation, schematic illustration of a stress-compensated precursor structure in a state of essentially net zero strain during a stage of fabrication of an STT-MRAM cell according to an embodiment of the present disclosure.

With reference to FIG. 8, according to embodiments of the present disclosure, the net strain exhibited by the primal precursor structure 600, 700 may be counteracted, wholly or in part, by forming a stress-compensating material 590 with an opposing stress, such that the net strain exhibited by the resulting stress-compensated precursor structure 800 comprises an altered strain, e.g., a net zero strain, as illustrated in FIG. 8.

The stress-compensating material 590 may be formed of a conductive material, e.g., tantalum, titanium, or a nitride material thereof. The conductive material used may be selected to avoid diffusion of the conductive material into neighboring regions of the cell core to be formed.

The stress-compensating material 590 may be formed by conventional material formation processes, such as sputtering. Therefore, the stress-compensating material 590 may be formed in the same reaction chamber used to form the other materials of the stress-compensated precursor structure 800, though the formation conditions may be different. Alternatively, the stress-compensating material 590 may be formed by physical vapor deposition (PVD), by ion beam deposition, by atomic layer deposition (ALD), by chemical vapor deposition (CVD), or by other known material-formation techniques. For example, ALD or CVD may be used to form a stress-compensating material 590 comprising a nitride of titanium or tantalum.

Figure 7:
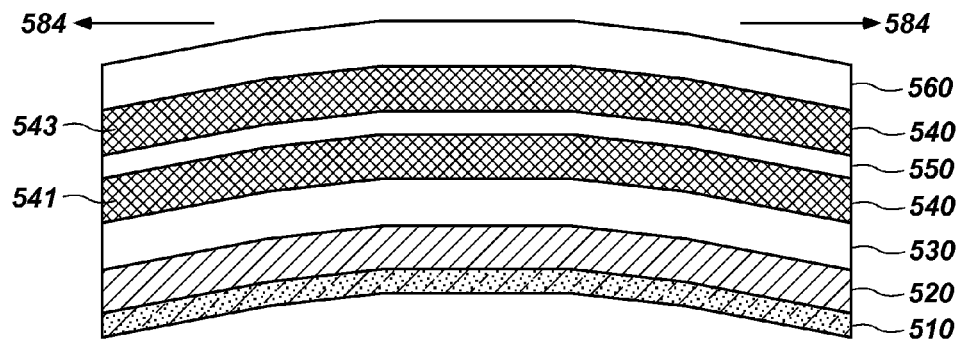
FIG. 7 is a cross-sectional, elevation, schematic illustration of a primal precursor structure in a state of compressive strain during a stage of fabrication of an STT-MRAM cell according to an embodiment of the present disclosure.

Though FIG. 8 illustrates the stress-compensating material 590 formed so as to be disposed above the primal precursor structure 600, 700 (FIGS. 6 and 7), in other embodiments, the stress-compensating material 590 may be formed so as to be disposed below the primal precursor structure 600, 700 (FIGS. 6 and 7). In such embodiments, the stress-compensating material 590 may be formed over a substrate and then the materials of the primal precursor structure 600, 700 (FIGS. 6 and 7) may be formed thereover.

The conditions of the formation process, e.g., pressure and species energy, may be tailored to form the stress-compensating material 590 at a desired level of stress so as to compensate, to a desired degree, stress experienced by the primal precursor structure 600, 700 (FIGS. 6 and 7). The stress induced by the stress-compensating material 590 may depend, at least in part, on the thickness of the stress-compensating material 590. It may also depend, at least in part, on the composition of the stress-compensating material 590. For example, in some embodiments, the stress-compensating material 590 may be formed to include a nitrogen gradient along a vertical axis of the stress-compensating material 590. The amount of nitrogen within the stress-compensating material 590 may impact the resulting stress experienced by the stress-compensating material 590. For example, a stress-compensating material 590 with a higher nitrogen content may exhibit a greater tensile or compressive stress, depending on the remaining composition of the stress-compensating material 590, than a stress-compensating material 590 with a lower nitrogen content. In some embodiments, the stress-compensating material 590 may be formed to exhibit a stress gradient through a dimension, e.g., thickness, of the stress-compensating material 590.

The desired opposing stress to be provided by the stress-compensating material 590 may also depend, at least in part, on the materials and thicknesses of the materials in the primal precursor structure 600, 700 that are to be etched during patterning. For example if the thicknesses of the materials in the primal precursor structure 600, 700 are relatively small, the desired opposing stress to be applied by the stress-compensating material 590 may be less than it would be were the thicknesses of the materials in the primal precursor structure 600, 700 to be relatively large. The desired opposing stress may also depend, at least in part, on later processing steps and their effects on the net overall strain exhibited by the materials of the STT-MRAM cell core. For example, if later processing steps are known to impose a lateral compressive stress upon the STT-MRAM cell core, the desired opposing stress to be applied by the stress-compensating material 590 may be a stress to produce a net lateral tensile strain in the resulting STT-MRAM cell core structure before the later processing steps.

In embodiments in which the stress-compensating material 590 is formed to be disposed on the primal precursor structure 600 exhibiting the tensile strain in direction 582, the stress-compensating material 590 may be formed to exhibit a compensating, opposing compressive stress. For example, and without limitation, the stress-compensating material 590 may be formed from tantalum by sputtering with an argon gas pressure of between about 0.1 millitorr to about 3.0 millitorr. The thickness of the stress-compensating material 590 may be in the range of from about 10 nanometers to about 100 nanometers. Because the stress-compensating material 590 is formed to apply an opposing, compressive stress, the resulting stress-compensated precursor structure 800 may exhibit a net zero strain, as illustrated in FIG. 8. Such a net zero strain may be desirable in embodiments utilizing a magnetic material 540 exhibiting a vertical magnetic orientation and a desired magnetic strength when in an unstrained state.

In other embodiments, the stress-compensating material 590 may be formed over the primal precursor structure 700 exhibiting the compressive strain in direction 584 by forming the stress-compensating material 590 to apply a tensile stress to produce the resulting stress-compensated precursor structure 800, as illustrated in FIG. 8. For example, the stress-compensating material 590 of such an embodiment may be formed from tantalum by sputtering with an argon gas pressure of greater than about 3.0 millitorr. The thickness of the stress-compensating material 590 may be in the range of from about 10 nanometers to about 100 nanometers. Because the stress-compensating material 590 is formed to apply an opposing, tensile stress, the resulting stress-compensated precursor structure 800 may exhibit a net zero strain, as illustrated in FIG. 8. Such a net zero strain may be desirable in embodiments utilizing a magnetic material 540 exhibiting a vertical magnetic orientation at a desired magnetic strength in an unstrained state.

In other embodiments, the stress-compensating material 590 may be formed so as to reduce, but not essentially fully compensate for, the tensile or compressive stress experienced by the primal precursor structure 600, 700, respectively. In such embodiments, therefore, a stress state experienced by the stress-compensating material 590 may be opposite to and less than an initial stress state experienced by the primal precursor structure 600, 700 (FIGS. 6 and 7). As a consequence, the resulting stress-compensated precursor structure (not shown) may exhibit a state of net tensile strain or a state of net compressive strain, respectively. Such embodiments may be desirable when utilizing a magnetic material 540 exhibiting a vertical magnetic orientation at a desired magnetic strength when in such a state of net tensile strain or the state of net compressive strain, respectively, or if processing steps, subsequent to patterning of a cell core structure, are known to impose a lateral stress upon the cell core structure.

In still other embodiments, the primal precursor structure may be formed to not exhibit a strain, i.e., formed at essentially zero stress. In such embodiments, therefore, a stress state experienced by the stress-compensating material 590 may be opposite to and substantially equal to an initial stress state experienced by the primal precursor structure 600, 700 (FIGS. 6 and 7). Forming a conventional hardmask over such net zero stressed primal precursor structure by conventional methods may form a hardmask material in a state of strain such that the hardmask material may apply a stress to the primal precursor structure. However, according to embodiments of the present disclosure, the stress-compensating material 590 may be formed over the net zero stressed primal precursor structure to also exhibit zero strain; therefore, the stress-compensating material 590 may be formed to not apply a stress to the net zero stressed primal precursor structure. Accordingly, the stress-compensated precursor structure 800 may exhibit the net zero strain. Such embodiments may be desirable when utilizing a magnetic material 540 exhibiting a vertical magnetic orientation at a desired magnetic strength when in an unstrained state.

Is still other embodiments, the stress-compensating material 590 may be formed to apply an over-compensating tensile stress or an over-compensating compressive stress, such that the resulting stress-compensated precursor structure exhibits a net tensile strain or a net compressive strain, respectively. In such embodiments, therefore, a stress state experienced by the stress-compensating material 590 may be opposite to and greater than an initial stress state experienced by the primal precursor structure 600, 700 (FIGS. 6 and 7). Such embodiments may be desirable when utilizing a magnetic material 540 exhibiting a vertical magnetic orientation at a desired magnetic strength when in such a state of net tensile strain or state of net compressive strain, respectively, or if subsequent processing steps are known to impose an opposing lateral stress upon the cell core structure. For example, if a free region exhibits negative magnetostriction, a compressive stress relaxation may enhance, rather than deteriorate, the magnetic strength of the free region.

Thus, the stress-compensating material 590 may be formed to tailor the resulting net strain exhibited by the stress-compensated precursor structure 800 to enhance or maintain a magnetic strength of the magnetic material 540 forming either or both the free region and the fixed region. Therefore, a vertical magnetic orientation of the free region, the fixed region, or both, may also be maintained.

Figure 9:
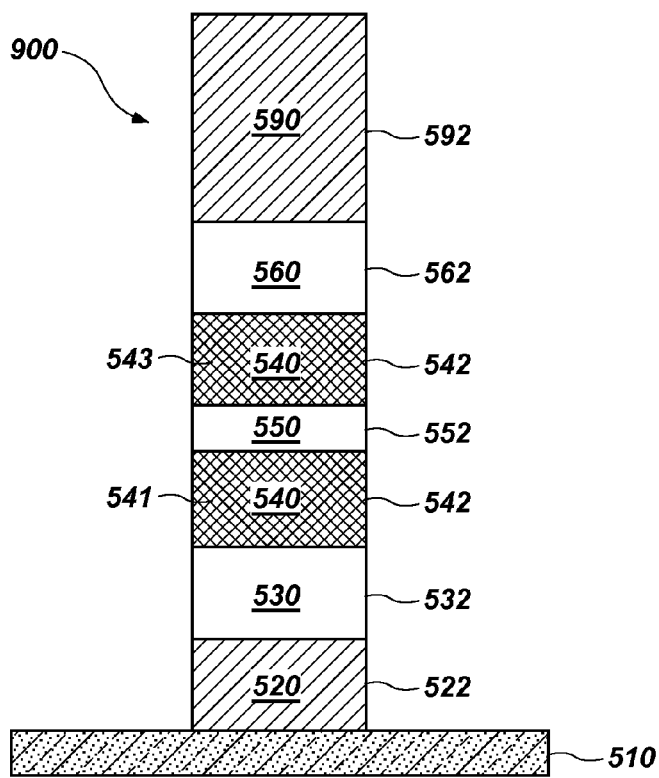
FIG. 9 is a cross-sectional, elevation, schematic illustration of a cell core structure during a stage of fabrication of an STT-MRAM cell according to an embodiment of the present disclosure.

The stress-compensated precursor structure 800 may be patterned to form a cell core structure 900, as illustrated in FIG. 9. The cell core structure 900 may be patterned by an etching process, e.g., using the stress-compensating material 590 as a hard mask. The stress-compensating material 590 may be non-sacrificial such that the resulting STT-MRAM cell core structure 900, as illustrated in FIG. 9, includes at least a part of the stress-compensating material 590. In some embodiments, the stress-compensating material 590 in the resulting STT-MRAM cell core structure 900 has a thickness substantially equal to a thickness at which the stress-compensating material 590 was originally formed (e.g., in the stress-compensated precursor structure 800 of FIG. 8). In other embodiments, the thickness of the stress-compensating material 590 in the resulting STT-MRAM cell core structure 900 is less than the thickness at which the stress-compensating material 590 was originally formed.

Etching the primal precursor structure 800 (FIG. 8) may be used to form the cell core structure 900 with a defined lower conductive region 522, which may form part of the conductive material functioning as the source line 506 (FIG. 5). The cell core structure 900 includes a magnetic region 542 formed from one of the magnetic materials 540, a non-magnetic region 552 formed from the non-magnetic material 550, and another magnetic region 542 formed from another of the magnetic materials 540, such that the non-magnetic region 552 is disposed between the magnetic regions 542. The cell core structure 900 may, optionally, include one or more lower intermediary regions 532 formed from the intermediary materials 530, and, also optionally, one or more upper intermediary regions 562 formed from the other intermediary materials 560. The stress-compensating material 590 may form part of an upper conductive region 592, which may form part of the conductive material functioning as the data/sense line 504 (FIG. 5) or part of a conductive contact between the STT-MRAM cell core structure 900 and the data/sense line 504.

Figure 10:
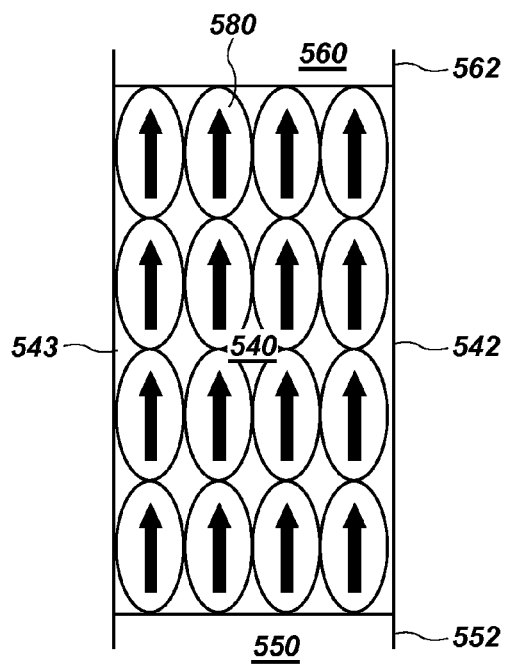
FIG. 10 is a cross-sectional, elevation, schematic illustration of a magnetic region of the cell core structure of FIG. 9.

The resulting cell core structure 900, after patterning, exhibits no strain, a tensile strain, or a compressive strain enhancing or maintaining a magnetic strength and, therefore, a vertical magnetic orientation 580 within the magnetic region 542, as illustrated in FIG. 10. The magnetic region 542 illustrated in FIG. 10 may be either or both of the free region and the fixed region of the cell core 502 (FIG. 5). Thus, though FIG. 10 illustrates a vertical magnetic orientation 580 in the upper-most magnetic material 543, in other embodiments, the vertical magnetic orientation 580 in the magnetic region 542 is in the lower-most magnetic material 541. Either of the illustrated magnetic regions 542, i.e., either the upper-most magnetic material 543 or the lower-most magnetic material 541, may function as the free region, with the other functioning as the fixed region.

Determining whether a net zero strain, a net tensile strain, or a net compressive strain is desired in the resulting cell core structure 900 may depend on the magnetostriction of the magnetic material 540 of the free region, the fixed region, or both. It may be desirable to achieve a maximum magnetic strength in the magnetic material 540 of the free region. If the magnetic material 540 of the free region has positive magnetostriction, meaning that the magnetic material tends to physically elongate in the direction of its magnetization, the stress-compensating material 590 may be formed so that the core structure 900 exhibits a net tensile strain or net zero strain. If the magnetic material 540 of the free region has negative magnetostriction, meaning that the material tends to contract in the direction of its magnetization, the stress-compensating material 590 may be formed so that the cell core structure 900 exhibits a net zero or compressive strain.

Further, though FIG. 9 illustrates etching of each of the lower conductive material 520, the lower intermediary material(s) 530, the lower magnetic material 540 (i.e., the lower-most magnetic material 541), the non-magnetic material 550, the upper magnetic material 540 (i.e., the upper-most magnetic material 543), the upper intermediary material(s) 560, and the stress-compensating material 590 to form the cell core structure 900, in other embodiments, fewer than all of the materials of the stress-compensated precursor structure 800 (FIG. 8) may be etched. For example, in some embodiments, only the materials overlying the non-magnetic material 550 (i.e., the upper magnetic material 540, the upper intermediary material(s) 560, and the stress-compensating material 590) may be etched. In such embodiments, then, the stress-compensating material 590 may be formed to apply an opposing stress compensating for the stress experienced by the combination of the upper magnetic material 540 (i.e., the upper-most magnetic material 543) and the upper intermediary material(s) 560. Therefore, the materials and thicknesses of the materials of the primal precursor structure 600, 700 (FIGS. 6 and 7) to be etched may be factored into the selection of the composition, formation processes, and dimensions of the stress-compensating material 590 formed to appropriately tailor the net strain of the stress-compensated precursor structure 800 (FIG. 8).

Accordingly, in some embodiments, the stress-compensating material 590 may be formed to apply an opposing stress to compensate for a stress experienced by a portion of or all of the primal precursor structure 600, 700 (FIGS. 6 and 7) so that essentially no material lateral expansion or contraction occurs following etching to form the cell core structure 900 (FIG. 9). In such embodiments, the stress-compensated precursor structure 800 (FIG. 8) may be configured to experience a net zero stress before etching, such that etching does not result in stress release in the form of lateral expansion or contraction of material of the cell core structure 900.

In other embodiments, the stress-compensating material 590 may be formed to apply an opposing stress to compensate for only a portion of a stress experienced by some or all of the primal precursor structure 600, 700 (FIGS. 6 and 7) so that some strain in the form of material lateral expansion or lateral contraction occurs following etching to form the cell core structure 900 (FIG. 9). Alternatively, to achieve the same effect, the stress-compensating material 590 may be formed to overcompensate for the stress experienced by some or all of the primal precursor structure 600, 700 (FIGS. 6 and 7). In such embodiments, the stress-compensated precursor structure 800 (FIG. 8) may be configured to experience a net tensile stress before etching, such that etching results in tensile stress release in the form of material lateral contraction. In other such embodiments, the stress-compensated precursor structure 800 (FIG. 8) may be configured to experience a net compressive stress before etching, such that etching results in compressive stress release in the form of material lateral expansion.

The resulting cell core structure 900 (FIG. 9), therefore, includes the magnetic region 542, i.e., the free region, the fixed region, or both, of the magnetic material 540 exhibiting the vertical magnetic orientation 580 at a desired magnetic strength, as illustrated in FIG. 10. The magnetic strength may be substantially the same as or greater than a magnetic strength of the magnetic material 540 in the primal precursor structure 600, 700 (FIGS. 6 and 7). Accordingly, the magnetic orientation exhibited by the magnetic material 540 in the primal precursor structure 600, 700 (FIGS. 6 and 7) may be the same magnetic orientation exhibited by the magnetic material 540 in the resulting cell core structure 900 (FIG. 9). Thus, the cell core 502 (FIG. 5) including the cell core structure 900 (FIG. 9) may exhibit an increased thermal stability for data retention. In addition, since the patterning of the stress-compensated precursor structure 800 (FIG. 8) may, in some embodiments, produce minimal lateral expansion or contraction in the resulting cell core structure 900 (FIG. 9), the magnetic strength of the cell core 502 (FIG. 5) may not deteriorate even when cell sizes are below 50 nm.

Accordingly, disclosed is a method of forming a memory cell, the method comprising forming a primal precursor structure comprising a non-magnetic material disposed between a magnetic material and another magnetic material. At least one of the magnetic material and the another magnetic material comprise a magnetic region exhibiting a vertical magnetic orientation at a magnetic strength. The primal precursor structure experiences an initial stress state. The method also comprises forming a stress-compensating material disposed on the primal precursor structure. The stress-compensating material experiences a stress state opposite the initial stress state experienced by the primal precursor structure. The method also comprises patterning the stress-compensating material and at least a portion of the primal precursor structure to form a memory cell while maintaining or enhancing the magnetic strength and the vertical magnetic orientation of the magnetic region.

Also disclosed is a memory cell comprising a magnetic cell core comprising a magnetic region exhibiting a vertical magnetic orientation at a magnetic strength. A conductive region on the magnetic cell core effects a beneficial strain within the magnetic region to maintain or enhance the magnetic strength of the magnetic region.

Still further, disclosed is a method of forming a memory cell, the method comprising forming a primal precursor structure over a substrate. The primal precursor structure experiences a state of stress. A conductive material is formed over the primal precursor structure to at least partially negate the state of stress experienced by the primary precursor structure. At least a portion of each of the primal precursor structure and the conductive material is removed to form a cell core without laterally expanding or contracting materials thereof.

Moreover, disclosed is a method of forming a memory cell structure, the method comprising forming a primal precursor structure over a substrate. Forming a primal precursor structure comprises forming a conductive material over the substrate, forming a magnetic material over the conductive material, forming a non-magnetic material over the magnetic material, and forming another magnetic material over the non-magnetic material. Another conductive material is formed over the primal precursor structure and applies a stress on the primal precursor structure. The method of forming a memory cell structure also comprises removing at least a portion of the primal precursor structure without forming a sacrificial material over the primal precursor structure to form a memory cell structure comprising a bottom electrode comprising the conductive material, a free region and a fixed region comprising the magnetic material and the another magnetic material, a non-magnetic region comprising the non-magnetic material, and a top electrode comprising the another conductive material. The free region exhibits a vertical magnetic orientation.

Further is disclosed a spin torque transfer magnetic random access memory (STT-MRAM) system, the system comprising at least one magnetic memory cell. The at least one magnetic memory cell comprises a magnetic region exhibiting a vertical magnetic orientation. The at least one magnetic memory cell also comprises a conductive material applying a stress to the magnetic region. At least one peripheral device is in operable communication with the at least one magnetic memory cell. The at least one peripheral device comprises circuitry configured to generate a current to the conductive material.

Figure 11:
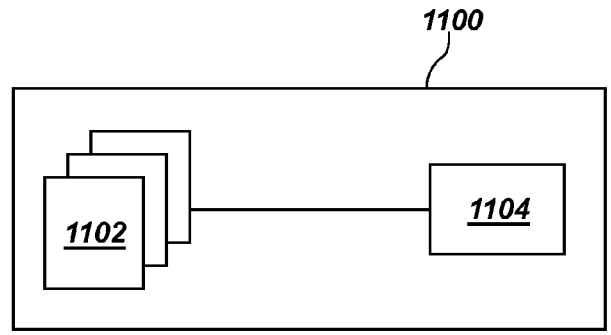
FIG. 11 is a simplified block diagram of a semiconductor device including memory cells of an embodiment of the present disclosure.

Also disclosed is a semiconductor device structure including at least one STT-MRAM cell, e.g., an array of STT-MRAM cells. With reference to FIG. 11, illustrated is a simplified block diagram of a semiconductor device structure 1100 implemented according to one or more embodiments described herein. The semiconductor device structure 1100 includes a memory array 1102 and a control logic component 1104. The memory array 1102 may include a plurality of any of the STT-MRAM cells 514 (FIG. 5) of the structures discussed above and formed according to a method described above. The control logic component 1104 may be configured to operatively interact with the memory array 1102 so as to read from or write to any or all memory cells (e.g., STT-MRAM cell 514) within the memory array 1102.

Figure 12:
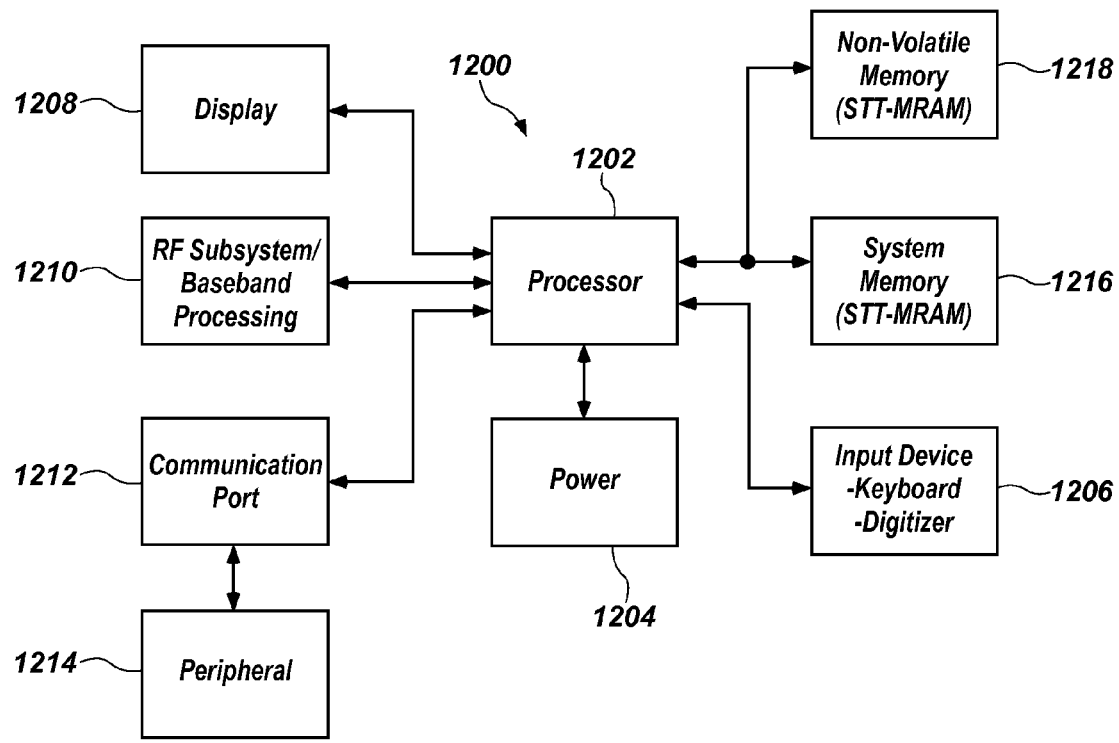
FIG. 12 is a simplified block diagram of a system implemented according to one or more embodiments of the present disclosure.

Also disclosed is a system including a memory array, e.g., memory array 1102. With reference to FIG. 12, depicted is a processor-based system 1200. The processor-based system 1200 may include various electronic devices manufactured in accordance with embodiments of the present disclosure. The processor-based system 1200 may be any of a variety of types, such as a computer, pager, cellular phone, personal organizer, control circuit, or other electronic device. The processor-based system 1200 may include one or more processors 1202, such as a microprocessor, to control the processing of system functions and requests in the processor-based system 1200. The processor 1202 and other subcomponents of the processor-based system 1200 may include magnetic memory devices manufactured in accordance with embodiments of the present disclosure.

The processor-based system 1200 may include a power supply 1204. For example, if the processor-based system 1200 is a portable system, the power supply 1204 may include one or more of a fuel cell, a power scavenging device, permanent batteries, replaceable batteries, and rechargeable batteries. The power supply 1204 may also include an AC adapter; therefore, the processor-based system 1200 may be plugged into a wall outlet, for example. The power supply 1204 may also include a DC adapter such that the processor-based system 1200 may be plugged into a vehicle cigarette lighter, for example.

Various other devices may be coupled to the processor 1202 depending on the functions that the processor-based system 1200 performs. For example, a user interface 1206 may be coupled to the processor 1202. The user interface 1206 may include input devices such as buttons, switches, a keyboard, a light pen, a mouse, a digitizer and stylus, a touch screen, a voice recognition system, a microphone, or a combination thereof. A display 1208 may also be coupled to the processor 1202. The display 1208 may include an LCD display, an SED display, a CRT display, a DLP display, a plasma display, an OLED display, an LED display, a three-dimensional projection, an audio display, or a combination thereof. Furthermore, an RF sub-system/baseband processor 1210 may also be coupled to the processor 1202. The RF sub-system/baseband processor 1210 may include an antenna that is coupled to an RF receiver and to an RF transmitter (not shown). A communication port 1212, or more than one communication port 1212, may also be coupled to the processor 1202. The communication port 1212 may be adapted to be coupled to one or more peripheral devices 1214, such as a modem, a printer, a computer, a scanner, or a camera, or to a network, such as a local area network, remote area network, intranet, or the Internet, for example.

The processor 1202 may control the processor-based system 1200 by implementing software programs stored in the memory. The software programs may include an operating system, database software, drafting software, word processing software, media editing software, or media playing software, for example. The memory is operably coupled to the processor 1202 to store and facilitate execution of various programs. For example, the processor 1202 may be coupled to system memory 1216, which may include one or more of spin torque transfer magnetic random access memory (STT- MRAM), magnetic random access memory (MRAM), dynamic random access memory (DRAM), static random access memory (SRAM), and other known memory types. The system memory 1216 may include volatile memory, non-volatile memory, or a combination thereof. The system memory 1216 is typically large so that it can store dynamically loaded applications and data. In some embodiments, the system memory 1216 may include semiconductor device structures (e.g., those including the semiconductor device structure 1100 of FIG. 11), memory cells (e.g., those including the cell core structure 900 of FIG. 9), or both.

The processor 1202 may also be coupled to non-volatile memory 1218, which is not to suggest that system memory 1216 is necessarily volatile. The non-volatile memory 1218 may include one or more of STT-MRAM, MRAM, read-only memory (ROM) such as an EPROM, resistive read-only memory (RROM), and flash memory to be used in conjunction with the system memory 1216. The size of the non-volatile memory 1218 is typically selected to be just large enough to store any necessary operating system, application programs, and fixed data. Additionally, the non-volatile memory 1218 may include a high-capacity memory such as disk drive memory, such as a hybrid-drive including resistive memory or other types of non-volatile solid-state memory, for example. The non-volatile memory 1218 may include STT-MRAM devices formed in accordance with embodiments of the present disclosure (e.g., those including the semiconductor device structure 1100 of FIG. 11), memory cells (e.g., those including the cell core structure 900 of FIG. 9), or both.

Accordingly, disclosed is a semiconductor device structure, comprising a spin torque transfer magnetic random access memory (STT-MRAM) array comprising a plurality of STT-MRAM cells. Each STT-MRAM cell of the plurality comprises a cell core comprising a magnetic region. Each STT-MRAM cell of the plurality also comprises a conductive material applying a stress to the cell core to maintain or enhance a magnetic strength of the magnetic region.

While the present disclosure is susceptible to various modifications and alternative forms in implementation thereof, specific embodiments have been shown by way of example in the drawings and have been described in detail herein. However, the present disclosure is not intended to be limited to the particular forms disclosed. Rather, the present disclosure encompasses all modifications, combinations, equivalents, variations, and alternatives falling within the scope of the present disclosure as defined by the following appended claims and their legal equivalents.

What is claimed is:

1. A method of forming a memory cell, the method comprising:
    forming a primal precursor structure comprising a non-magnetic material disposed between a magnetic material and another magnetic material, at least one of the magnetic material and the another magnetic material comprising a magnetic region exhibiting a vertical magnetic orientation at a magnetic strength, the primal precursor structure experiencing an initial stress state;
    forming a stress-compensating material disposed on the primal precursor structure, the stress-compensating material experiencing a stress state opposite the initial stress state experienced by the primal precursor structure; and
    patterning the stress-compensating material and at least a portion of the primal precursor structure to form a memory cell while maintaining or enhancing the magnetic strength and the vertical magnetic orientation of the magnetic region.

2. The method of claim 1, wherein forming a stress-compensating material comprises forming the stress-compensating material disposed on the primal precursor structure, the stress-compensating material experiencing a stress state opposite to and substantially equal to the initial stress state experienced by the primal precursor structure.

3. The method of claim 1, wherein forming a stress-compensating material comprises forming the stress-compensating material disposed on the primal precursor structure, the stress-compensating material experiencing a stress state opposite to and greater than the initial stress state experienced by the primal precursor structure.

4. The method of claim 1, wherein forming a stress-compensating material comprises forming the stress-compensating material disposed on the primal precursor structure, the stress-compensating material experiencing a stress state opposite to and less than the initial stress state experienced by the primal precursor structure.

5. The method of claim 1, wherein forming a primal precursor structure comprises:
    forming the magnetic material;
    forming the non-magnetic material over the magnetic material; and
    forming the another magnetic material over the non-magnetic material.

6. The method of claim 1, wherein forming a stress-compensating material comprises forming a conductive material over the primal precursor structure.

7. The method of claim 1, wherein forming a stress-compensating material comprises forming a non-sacrificial material over the primal precursor structure.

8. The method of claim 1, wherein forming a primal precursor structure comprises forming the primal precursor structure experiencing an initial tensile stress state.

9. The method of claim 8, wherein forming a stress-compensating material comprises forming the stress-compensating material disposed on the primal precursor structure, the stress-compensating material experiencing a compressive stress state opposing the initial tensile stress state of the primal precursor structure.

10. The method of claim 1, wherein forming a primal precursor structure comprises forming the primal precursor structure experiencing an initial compressive stress state.

11. The method of claim 10, wherein forming a stress-compensating material comprises forming the stress-compensating material disposed on the primal precursor structure, the stress-compensating material experiencing a tensile stress state opposing the initial compressive stress state of the primal precursor structure.

12. A memory cell, comprising:
    a magnetic cell core comprising a magnetic region exhibiting a vertical magnetic orientation at a magnetic strength; and
    a conductive region on the magnetic cell core effecting a beneficial strain within the magnetic region to maintain or enhance the magnetic strength of the magnetic region, the conductive region spaced from the magnetic region by at least one other region.

13. The memory cell of claim 12, wherein the conductive region comprises at least one of tantalum and titanium.

14. The memory cell of claim 12, wherein the conductive region comprises at least one of tantalum nitride and titanium nitride.

15. The memoir cell of claim 12, wherein the conductive region comprises a nitrogen gradient comprising at least one of tantalum nitride and titanium nitride.

16. The memory cell of claim 12, further comprising a top electrode comprising the conductive region.

17. A method of forming a memory cell, the method comprising:
forming a primal precursor structure over a substrate, the primal precursor structure experiencing a state of stress;
forming a conductive material over the primal precursor structure to at least partially negate the state of stress experienced by the primal precursor structure; and
removing at least a portion of each of the primal precursor structure and the conductive material to form a cell core without laterally expanding or contracting materials thereof.

18. The method of claim 17, wherein forming a primal precursor structure over a substrate comprises forming a combination of magnetic and non-magnetic materials over the substrate, the primal precursor structure exhibiting a state of compressive stress.

19. The method of claim 17, wherein:
forming a primal precursor structure over a substrate comprises forming a primal precursor structure over the substrate, the primal precursor structure experiencing a state of tensile stress; and
forming a conductive material over the primal precursor structure comprises forming the conductive material over the primal precursor structure to at least partially negate the state of tensile stress experienced by the primal precursor structure.

20. A method of forming a memory cell structure, the method comprising:
forming a primal precursor structure over a substrate, comprising:
forming a conductive material over the substrate;
forming a magnetic material over the conductive material;
forming a non-magnetic material over the magnetic material;
forming another magnetic material over the non-magnetic material; and
forming at least one intermediary material over the another magnetic material;
forming another conductive material over the primal precursor structure, the another conductive material applying a stress to the primal precursor structure; and
removing at least a portion of the primal precursor structure without forming a sacrificial material over the primal precursor structure to form a memory cell structure comprising a bottom electrode comprising the conductive material, a free region and a fixed region comprising the magnetic material and the another magnetic material, a non-magnetic region comprising the non-magnetic material, an upper intermediary region comprising the at least one intermediary material, and a top electrode comprising the another conductive material, the free region exhibiting a vertical magnetic orientation.

21. The method of claim 20, wherein forming another conductive material over the primal precursor structure comprises forming the another conductive material over the primal precursor structure, the another conductive material applying to the primal precursor structure a stress oppositely directed to a net stress state of a portion of the primal precursor structure.

22. The method of claim 20, wherein forming another conductive material over the primal precursor structure comprises forming the another conductive material over the primal precursor structure, the another conductive material applying to the primal precursor structure a stress oppositely directed to a net stress state of the primal precursor structure.

23. The method of claim 20, wherein forming another conductive material over the primal precursor structure comprises sputtering the another conductive material over the primal precursor structure.

24. A semiconductor device structure, comprising:
a spin torque transfer magnetic random access memory (STT-MRAM) array comprising;
a plurality of STT-MRAM cells, at least one STT-MRAM cell of the plurality comprising:
a cell core comprising a magnetic region; and
a conductive material spaced from the magnetic region and applying a stress to the cell core to maintain or enhance a magnetic strength of the magnetic region.

25. The semiconductor device structure of claim 24, wherein the magnetic region comprises CoFeB in an atomic ratio of about 20:60:20.

26. The semiconductor device structure of claim 24, wherein the magnetic region comprises CoFeB in an atomic ratio of about 60:20:20.

27. The semiconductor device structure of claim 24, wherein the conductive material comprises at least one of tantalum, titanium, tantalum nitride, and titanium nitride.

28. A spin torque transfer magnetic random access memory (STT-MRAM) system, comprising:
at least one magnetic memory cell comprising:
a magnetic region exhibiting a vertical magnetic orientation;
a conductive material applying a stress to the magnetic region; and
another region between the magnetic region and the conductive material; and
at east one peripheral device in operable communication with the at least one magnetic memory cell, the at least one peripheral device comprising circuitry configured to generate a current to the conductive material.

* * * * *

UNITED STATES PATENT AND TRADEMARK OFFICE
CERTIFICATE OF CORRECTION

PATENT NO. : 8,923,038 B2  
APPLICATION NO. : 13/527173  
DATED : December 30, 2014  
INVENTOR(S) : Witold Kula et al.

Page 1 of 1

It is certified that error appears in the above-identified patent and that said Letters Patent is hereby corrected as shown below:

In the Claims

In column 18, line 65, in Claim 15, delete "memoir" and insert -- memory --, therefor.

In column 20, line 23, in Claim 24, delete "comprising;" and insert -- comprising: --, therefor.

In column 20, line 49, in Claim 28, delete "at east" and insert -- at least --, therefor.

Signed and Sealed this  
Twenty-fourth Day of March, 2015

Michelle K. Lee  
*Director of the United States Patent and Trademark Office*